United States Patent [19]
Zah

[11] Patent Number: 4,965,525
[45] Date of Patent: Oct. 23, 1990

[54] ANGLED-FACET FLARED-WAVEGUIDE TRAVELING-WAVE LASER AMPLIFIERS

[75] Inventor: Chung-En Zah, Marlboro, N.J.

[73] Assignee: Bell Communications Research, Inc., Livingston, N.J.

[21] Appl. No.: 435,625

[22] Filed: Nov. 13, 1989

[51] Int. Cl.$^5$ .............................................. H01S 3/08
[52] U.S. Cl. .................................... 330/4.3; 350/96.3
[58] Field of Search .................... 330/4.3; 372/49, 66; 350/96.3; 455/610; 357/30

[56] References Cited

U.S. PATENT DOCUMENTS

| | | | |
|---|---|---|---|
| 3,980,392 | 9/1976 | Auracher | 350/96.14 |
| 4,817,106 | 3/1989 | Thompson | 372/50 |
| 4,872,180 | 10/1989 | Rideant et al. | 372/99 |

OTHER PUBLICATIONS

Kaneno et al., "Transverse Mode Control . . . Model Filters"; 1988; IEEE Cat. No. 88CH 2528-8, Int. Elec. Dev. Mtg.; SF, Calif., pp. 315-318.

Zah et al.; "1.3 mm GaInAsP Near . . . Coatings"; 9/29/88, Electronics Letters, vol. 24, #20, pp. 1275-1276.

Salzman et al; "Modal Coupling in tilted . . . Amplifiers"; 6/88, Optics Letters, vol. 13, #6, pp. 455-457.

Salzman et al.; "The Tilted Waveguide Semiconductor Laser Amplifier"; J. Appl. Phys., vol. 64, #4, 8/15/88.

"Fabrication and Performance of 1.5 $\mu$m GaInAsP Travelling-Wave Laser Amplifiers with Angled Facets", C. E. Zah et al., Electronics Letters, vol. 23, No. 19, pp. 990-992, Sep. 10, 1987.

"1.3 $\mu$m GaInAsP Near-Travelling-Wave Laser Amplifiers made by Combination of Angled Facets and Antireflection Coatigs", C. E. Zah et al, Electron. Lett., vol. 24, No. 20, pp. 1275-1276, Sep. 29, 1988.

"Recent Progress in Semiconductor Laser Amplifiers", T. Saitoh et al., J. Lightwave Technol., vol. 6, No. 11, pp. 1656-1664, Nov. 1988.

*Primary Examiner*—Nelson Moskowitz
*Attorney, Agent, or Firm*—James W. Falk; Leonard Charles Suchyta

[57] ABSTRACT

The effective reflectivity of angled antireflection-coated facets of a traveling-wave laser amplifier is significantly reduced by flaring the waveguiding portion of the amplifier in the immediate vicinity of the facets. In this way, low-reflectivity facets are achieved with simple low-cost antireflection coatings, thereby providing economical amplifiers characterized by wide bandwidth and high output saturation power.

12 Claims, 1 Drawing Sheet

ANGLED-FACET FLARED-WAVEGUIDE TRAVELING-WAVE LASER AMPLIFIERS

BACKGROUND OF THE INVENTION

This invention relates to semiconductor laser amplifiers and, more particularly, to semiconductor traveling-wave laser amplifiers characterized by wide bandwidth and high output saturation power.

In an optical fiber transmission system, traveling-wave laser amplifiers are designed to directly amplify optical signals without converting them into electrical signals. Such amplifiers are particularly useful as optical repeaters and preamplifiers in high-bit-rate and multi-channel systems.

To achieve a high-quality traveling-wave laser amplifier exhibiting wide bandwidth and high output saturation power, it is necessary that the facet reflectivity of these semiconductor devices be extremely low. Previously, this type of amplifier relied solely on extremely low-reflectivity coatings formed on the facets of the device. Coupling between transmitted and reflected modes was thereby reduced sufficiently to suppress the Fabry-Perot gain resonance of the device. Such low facet reflectivity was achieved only by extremely tight control of the refractive indices and thickness of dielectric coatings formed on the facets of the device.

In an effort to relax the difficult low-reflectivity coating requirement involved in making high-quality semiconductor traveling-wave laser amplifiers, various modified structures have bee proposed and demonstrated. One advantageous such modified structure is described in "Fabrication and Performance of 1.5 $\mu$m GaInAsP Traveling-Wave Laser Amplifiers With Angled Facets", *Electronics Letters*, 1987, 23, pages 990–992. In the described angled-facet device, the Fabry-Perot resonance is suppressed by slanting the waveguide (gain region) of the device from the cleavage plane such that internal light reflected by the cleaved facets does not couple back into the waveguide directly and is therefore mostly lost. By adding low-reflectivity (antireflection) coatings to such an angled-facet device, a high quality traveling-wave laser amplifier characterized by high coupling efficiency to single-mode optical fibers is realized, as described in "1.3 $\mu$m GaInAsP Near-Traveling-Wave Laser Amplifiers Made By Combination of Angled Facets And Antireflection Coatings", *Electronics Letters*, 1988, 24 pages 1275–1276.

Even without in-situ monitoring of the output characteristics of an angled-facet traveling-wave laser amplifier during deposition of its antireflection facet coatings, relatively low effective modal facet reflectivity can be routinely realized. Less than 0.1% effective modal reflectivity has been achieved at a wavelength of 1.3 $\mu$m in a buried hererostructure and at 1.5 $\mu$m in a ridge-waveguide structure.

In principle, the effective modal reflectivity of an angled-facet antireflection-coated traveling-wave laser amplifier can be further reduced by increasing the slant angle of the waveguide or increasing the mode width of light propagated in the waveguide. However, a limitation on such reduction is imposed by the fact that as the slant angle is increased the required antireflection coating becomes polarization dependent. Further, as the slant angle increases, coupling losses between the amplifier and associated input and output fibers also increase. And, as the mode width is increased, high-order lateral modes having wide angular spread are supported by the waveguide. At some point, the reflectivity attributed to these high-order modes negates the decrease in reflectivity of the fundamental mode and causes the overall effective modal reflectivity to actually increase.

Accordingly, efforts have continued by workers skilled in the art aimed at trying to devise simple and effective ways of further reducing the effective modal reflectivity of traveling-wave laser amplifiers. It was recognized that these efforts, if successful, had the potential for providing low-cost high-quality laser amplifiers suitable for use in commercially important transmission systems.

SUMMARY OF THE INVENTION

In accordance with the principles of the present invention, the effective modal reflectivity of an angled-facet antireflection-coated traveling-wave laser amplifier is significantly reduced by flaring the waveguiding portion of the amplifier in the vicinity of the facets. In that way, the mode width of the fundamental mode is gradually increased from what it is in the straight or main middle portion of the waveguide. This mode-width transition of the fundamental mode accomplished with very little loss. Moreover, high-order lateral modes generated in the flared portions near the facets suffer both high transition loss when they are reflected back to the straight waveguide and less optical gain in the straight waveguide due to a smaller optical confinement factor in the straight portion.

In one embodiment of the invention, the entire extent of the waveguide in the amplifying device includes both an active region and a co-extensive passive waveguiding region. In another embodiment, the waveguides in the flared portions each include only passive waveguiding regions.

BRIEF DESCRIPTION OF THE DRAWINGS

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
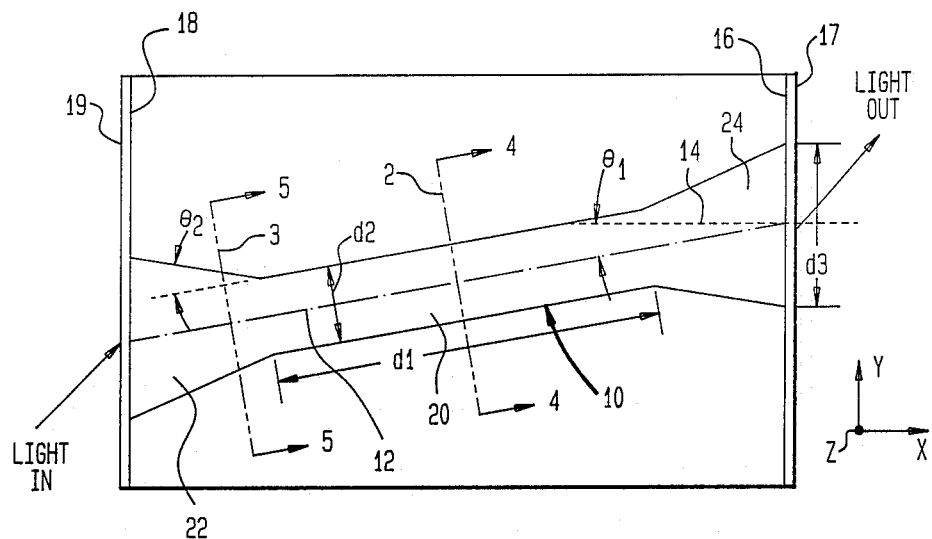
FIG. 1 is a simplified schematic view of an index-guided semiconductor traveling-wave laser amplifier made in accordance with the principles of the present invention showing only a top view of the waveguiding portion thereof.

In accordance with the invention, the active waveguide (gain region) of a conventional index-guided traveling-wave laser amplifier is slanted from the cleavage or facet plane such that any internal light reflected by cleaved facets does not couple strongly back into the waveguide and is therefore mostly lost. Thus, as seen in FIG. 1, waveguide 10 having main longitudinal axis 12 is disposed at an angle $\theta_1$ with respect to line 14 which is perpendicular to a planar right-hand facet 16 of the depicted amplifying device. Accordingly, the depicted device may be regarded as having angled facets relative to the slanted waveguide.

The device represented in FIG. 1 also includes a planar left-hand facet 18, which is parallel to the facet 16. By way of example, each of the depicted facets is covered with a simple single-layer antireflection coating made of a dielectric material. Each of these antireflection coatings is designed to have a refractive index equal to the square root of the effective refractive index of the waveguide and a thickness equal to approximately one-quarter wavelength of the light propagated in the antireflection coating. In FIG. 1, the coatings formed on the facets 16 and 18 are designated by reference numerals 17 and 19, respectively.

The slanted waveguide 10 of FIG. 1 includes a relatively long straight or main middle portion 20 and relatively short flared portions 22 and 24 at the respective ends of the straight portion 20. Angle $\theta_2$ is a measure of the extent of the flare of the portions 22 and 24 with respect to the straight portion 20. As specified later below, the angle $\theta_2$ is selected to minimize transition losses in the optical signal that propagates in the waveguide 10.

Assuming a Gaussian field distribution of the optical signal propagated in the slanted waveguide 10 of FIG. 1, it is known that the effective modal reflectivity R of the depicted device is given by the expression $$R = R_o e^{-(\frac{\pi n W \theta_i}{\lambda})^2} \qquad (1)$$

where $R_0$ is the Fresnel reflectance, n is the effective refractive index of the waveguide 10, W is the mode width of the optical signal propagated in the waveguide 10, $\theta_1$ is the slant angle of the waveguide 10, and $\lambda$ is the wavelength of light propagated in the waveguide 10. It is evident therefore that the effective modal reflectivity of a known slanted-waveguide device can be reduced by increasing $\theta_1$ or increasing W. But, as discussed earlier above, there are practical limitations to the extent to which $\theta_1$ or W can be increased.

In accordance with the principles of the present invention, the mode width of the optical signal that propagated in the straight portion 20 of the waveguide 10 of FIG. 1 is gradually changed as it propagates to or from the flared portions 22 and 24. Because of the gradual change, transition losses experienced by optical signals propagating between the straight and flared portions of the waveguide 10 are relatively small.

In the flared portions 22 and 24 (FIG. 1) near the facets 18 and 16, respectively, the mode width W of the fundamental mode propagated in the waveguide 10 is significantly larger than it is in the straight portion 20. Accordingly, the effective modal reflectivity of the fundamental mode at the antireflection-coated facets is thereby substantially reduced. In one specific illustrative embodiment of the invention, described later below, the effective modal reflectivity of angled antireflection-coated facets to the fundamental mode was reduced by an order of magnitude simply by flaring the ends of the slanted waveguide in the particular manner depicted in FIG. 1.

High-order lateral modes are generated in the flared portions 22 and 24 of FIG. 1. But in practice andy component of these modes that is reflected from the facets 16 and 18 back toward the straight portion 20 of the waveguide 10 suffers a high transition loss and, due to a smaller optical confinement factor, experiences considerably less optical gain in the portion 20. Hence, the ordinary tendency of these high-order modes to increase the overall effective modal reflectivity of an angled facet-traveling-wave laser amplifier is thereby rendered virtually negligible.

In an optical transmission system, it is generally desirable that the gain of any amplifier included in the system be polarization independent. For a traveling-wave laser amplifier, it is known that such polarization-independent gain can be achieved by proper selection of the height and width of the elongated waveguide included in the amplifier. But in practice the dimensions selected for such a waveguide to achieve polarization-independent gain may cause the width of the fundamental mode propagated therein to be less than optimal from the standpoint of low effective modal reflectivity. Hence, some compromise is usually required between these competing considerations, and as a result overall device performance is thereby often deleteriously affected.

In accordance with the present invention, the waveguide 10 of FIG. 1 can be proportioned to optimize polarization-independent gain in the relatively long straight portion 20. Separately, the relatively short flared portions 22 and 24 are designed to optimize effective modal reflectivity. In that way, an advantageous device characterized by both substantially polarization-independent gain and extremely low effective modal reflectivity can be realized.

It is known that traveling-wave laser amplifiers can be made from a variety of semiconductor materials to achieve amplification at different specified wavelengths. Herein, for purposes of a specific illustrative example, a particular index-guided device designed to amplify optical signals having a wavelength of 1.5 μm will be described. Moreover, it is known that a traveling-wave laser amplifier can be fabricated in various ways. Thus, such an amplifier can be built, for example, as a buried heterostructure or as a ridge waveguide structure, both of which are conventional and well known in the art. For illustrative purposes, the specific example described below will be of a buried heterostructure.

In one specific illustrative embodiment of the invention, the length d1 of the straight portion 20 of the waveguide 10 shown in FIG. 1 is about 308 μm. The width d2 of the straight portion 20 is approximately 1.5 μm. Each of the end portions 22 and 24 linearly flares from its respective end of the straight portion 20. To minimize transition losses, the angle $\theta_2$ has a value of about one degree. (Satisfactory operation of the device is achieved for values of $\theta_2$ that are greater than zero and equal to or less than approximately 1.5 degrees). The width d3 of each of the flared portions 22 and 24 at the intersection with its respective facet is about 4.5 μm. The length of each flared portion as measured along the main longitudinal axis 12 is 80 μm.

In the specified embodiment, the slanted waveguide 10 is oriented at an angle $\theta_1$ of about 7 degrees from the [011] direction of a semiconductor wafer in which the device is fabricated. The wafer is cleaved along the [011] direction to form the facets 16 and 18.

Advantageously, the facets 16 and 18 of the specified embodiment are each coated with a simple single layer of an antireflective material. For a wavelength of 1.5

μm, each of the facets is coated, for example, by standard electron-beam evaporation techniques with a quarter-wavelength-thick layer of $SiO_x$, where x has a value between 1 and 2. Other known single-layer or multi-layer materials are also suitable for forming the antireflection coatings 17 and 19 indicated in FIG. 1.

Figure 2:
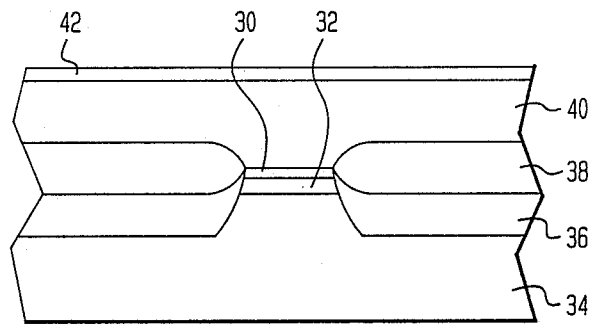
FIG. 2 is a cross-sectional view at line 2 of FIG. 1 in the direction of arrow 4 showing in schematic form the straight waveguiding portion of a buried heterostructure traveling-wave laser embodiment of the invention.

A particular illustrative buried heterostructure version of an index-guided amplifier of the type schematically represented in FIG. 1 is shown in FIG. 2. Fabrication of such a structure is easily accomplished by conventional chemical-vapor-deposition or liquid-phase-epitaxy techniques well known in the art. A buried active or gain region 30 constituting a cross-section of the straight portion 20 of the waveguide 10 of FIG. 1 is depicted in FIG. 2. By way of example, the region 30 has a width of about 1.5 μm and a height of approximately 0.2 μm. The region 30, which is used for current and optical confinement, is made of a standard quarternary material comprising In, Ga, As and P whose composition is selected to achieve the bandgap needed for amplification at 1.5 μm, as is well known in the art.

Illustratively, a waveguiding layer 32 is deposited directly under the active region 30 shown in FIG. 2. By way of example, the layer 32 comprises a 1.3-μm quarternary material including In,Ga,As and P. In some embodiments, the layer 32 is not included. In those cases, the region 30 functions both as a gain medium and as a waveguiding layer. But including the layer 32 usually reduces the polarization dependence of optical gain and, as will be described later below, also provides a basis for an advantageous modification of the depicted device. In any case, most if not all of the gain of the device occurs in the region 30 in the relatively long straight portion 20.

The other parts of the specific illustrative device shown in FIG. 2 include a substrate 34 made of n-type InP, and layers 36, 38 and 40 made of p-type InP, n-type InP and p-type InP, respectively. Capping the device is a contact layer 42 made of a 1.3-μm quarternary material comprising In,Ga,As and P.

Figure 3:
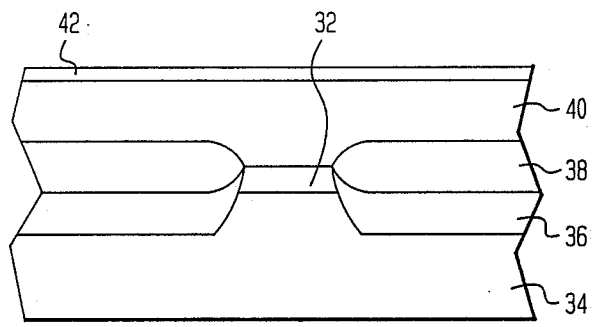
FIG. 3 is a cross-sectional view at line 3 of FIG. 1 in the direction of arrow 5 showing in schematic form one of the flared waveguiding portions of a buried heterostructure traveling-wave laser embodiment of the invention.

FIG. 3 is a cross-sectional depiction of the flared portion 22 shown in FIG. 1. The layers 34, 36, 38, 40 and 42 of FIG. 3 are identical to the correspondingly numbered layers of FIG. 2. If desired, the layers 30 and 32 shown in FIG. 2 may extend throughout the entire longitudinal extent of the flared portions 22 and 24. In that case, the layers 30 and 32 in the flared portions would, for the specific illustrative example considered herein, each linearly vary in width from about 1.5 μm to approximately 4.5 μm.

Alternatively, as represented in FIG. 3, the flared regions may include only the waveguiding layer 32 of FIG. 2. In such an embodiment, the active region 30 is not extended beyond the straight waveguide portion 20 (FIG. 1) into the flared portions. As a result, waveguiding but not gain is provided in the relatively limited-extent flared portions, thereby to avoid polarization-dependent gain in the flared waveguide region. The consequence of this is to further decrease the polarization dependence of the amplifier at the expense of slightly decreasing the overall gain of the device.

Finally, it is to be understood that the above-described structures and techniques are only illustrative of the principles of the present invention. In accordance with these principles, numerous modifications and alternatives may be devised by those skilled in the art without departing from the spirit and scope of the invention. For example, in some applications of practical importance the inventive device described herein can constitute one component of an integrated optical assembly. In such and assembly, one or both ends of the device can be coupled to associated components included in the assembly.

What is claimed is:

1. A traveling-wave laser amplifier comprising:
   a semiconductor body having at least one planar antireflection-coated facet,
   and a waveguide in said body extending to said facet for propagating the fundamental mode of an optical signal,
   said waveguide having a main longitudinal axis that is disposed off-normal with respect to said planar facet, said waveguide having a relatively long portion that has the same width at all points along said axis, and said waveguide having a relatively short end portion comprising a flared portion that extends between one end of said long portion and said facet for reducing the effective modal reflectivity of the fundamental mode at said antireflection-coated facet.

2. An amplifier as in claim 1 wherein said semiconductor body has two spaced-apart parallel planar antireflection-coated facets, wherein said waveguide extends between said facets, wherein said relatively long portion of said waveguide comprises a middle portion thereof, and wherein said waveguide has relatively short end portions comprising flared portions that respectively extend between the ends of said middle portion and said facets.

3. An amplifier as in claim 2 wherein the end portions of said waveguide are linearly flared.

4. An amplifier as in claim 3 wherein the waveguide in said middle portion comprises an active gain medium.

5. An amplifier as in claim 4 wherein the waveguide in said end portions also comprises said active gain medium.

6. An amplifier as in claim 3 wherein the waveguide in said middle portion comprises an active gain medium and an adjacent waveguiding medium.

7. An amplifier as in claim 6 wherein the waveguide in said end portions comprised said waveguiding medium.

8. An amplifier as in claim 7 wherein the waveguide in said end portions further comprises said gain medium.

9. An amplifier as in claim 3 wherein the main longitudinal axis of said waveguide is disposed at an angle of about 7 degrees with respect to a normal to said facets.

10. An amplifier as in claim 9 wherein each of said facets is antireflection-coated with a single layer of $SiO_x$, where x has a value between 1 and 2.

11. An amplifier as in claim 10 wherein said middle portion includes an active gain medium comprising a quarternary material including In,Ga,As and P whose composition is selected to provide gain at a wavelength of 1.5 μm.

12. An amplifier as in claim 11 wherein each of said end portions is flared from its respective end of said middle portion by an angle whose value is greater than zero and equal to or less than 1.5 degrees.

* * * * *

UNITED STATES PATENT AND TRADEMARK OFFICE
CERTIFICATE OF CORRECTION

PATENT NO. : 4,965,525

DATED : October 23, 1990

INVENTOR(S) : Chung-En Zah

It is certified that error appears in the above-identified patent and that said Letters Patent is hereby corrected as shown below:

Title Page:
In the abstract, "effective reflectivity" should read --effective modal reflectivity--.
Column 1, line 31, "bee" should read --been--.
Column 2, line 24, after "mode" insert --is--.
Column 3, line 67, "andy" should read --any--.
Column 4, line 65, "[011]" should read --[01$^-$1]--.
Column 6, line 6, "and" should read --an--;
       line 46, "comprised" should read --comprises--.

Signed and Sealed this

Twenty-sixth Day of April, 1994

*Attest:*

BRUCE LEHMAN

*Attesting Officer*     *Commissioner of Patents and Trademarks*